(12) United States Patent
Sun et al.

(10) Patent No.: US 10,460,966 B2
(45) Date of Patent: Oct. 29, 2019

(54) ENCAPSULATED INSTRUMENTED SUBSTRATE APPARATUS FOR ACQUIRING MEASUREMENT PARAMETERS IN HIGH TEMPERATURE PROCESS APPLICATIONS

(71) Applicant: KLA-Tencor Corporation, Milpitas, CA (US)

(72) Inventors: Mei Sun, Milpitas, CA (US); Earl Jensen, Milpitas, CA (US); Jing G. Zhou, Milpitas, CA (US); Ran Liu, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 190 days.

(21) Appl. No.: 15/277,792

(22) Filed: Sep. 27, 2016

(65) Prior Publication Data

US 2017/0365495 A1 Dec. 21, 2017

Related U.S. Application Data

(60) Provisional application No. 62/350,688, filed on Jun. 15, 2016.

(51) Int. Cl.
*H05K 5/06* (2006.01)
*H01L 21/67* (2006.01)
*H01L 21/687* (2006.01)

(52) U.S. Cl.
CPC .. *H01L 21/67253* (2013.01); *H01L 21/67248* (2013.01); *H01L 21/68764* (2013.01)

(58) Field of Classification Search
None
See application file for complete search history.

(56) References Cited

U.S. PATENT DOCUMENTS

| | | | |
|---|---|---|---|
| 5,919,383 A | 7/1999 | Beguin et al. | |
| 2005/0081398 A1 | 4/2005 | Sun et al. | |
| 2006/0174720 A1* | 8/2006 | Renken | G01D 9/005 73/866.1 |
| 2007/0251338 A1 | 11/2007 | Wiese et al. | |
| 2010/0155098 A1 | 6/2010 | Sun et al. | |
| 2011/0079426 A1 | 4/2011 | Steffler | |
| 2015/0099948 A1* | 4/2015 | Kapusta | A61B 5/14552 600/323 |
| 2017/0219437 A1 | 8/2017 | Sun et al. | |

\* cited by examiner

*Primary Examiner* — Daniel S Larkin
(74) *Attorney, Agent, or Firm* — Suiter Swantz pc llo

(57) ABSTRACT

An apparatus includes an instrumented substrate apparatus, a substrate assembly including a bottom and top substrate mechanically coupled, an electronic assembly, a nested enclosure assembly including an outer and inner enclosure wherein the outer enclosure encloses the inner enclosure and the inner enclosure encloses the electronic assembly. An insulating medium between the inner and outer enclosure and a sensor assembly communicatively coupled to the electronic assembly including one or more sensors disposed at one or more locations within the substrate assembly wherein the electronic assembly is configured to receive one or more measurement parameters from the one or more sensors.

46 Claims, 14 Drawing Sheets

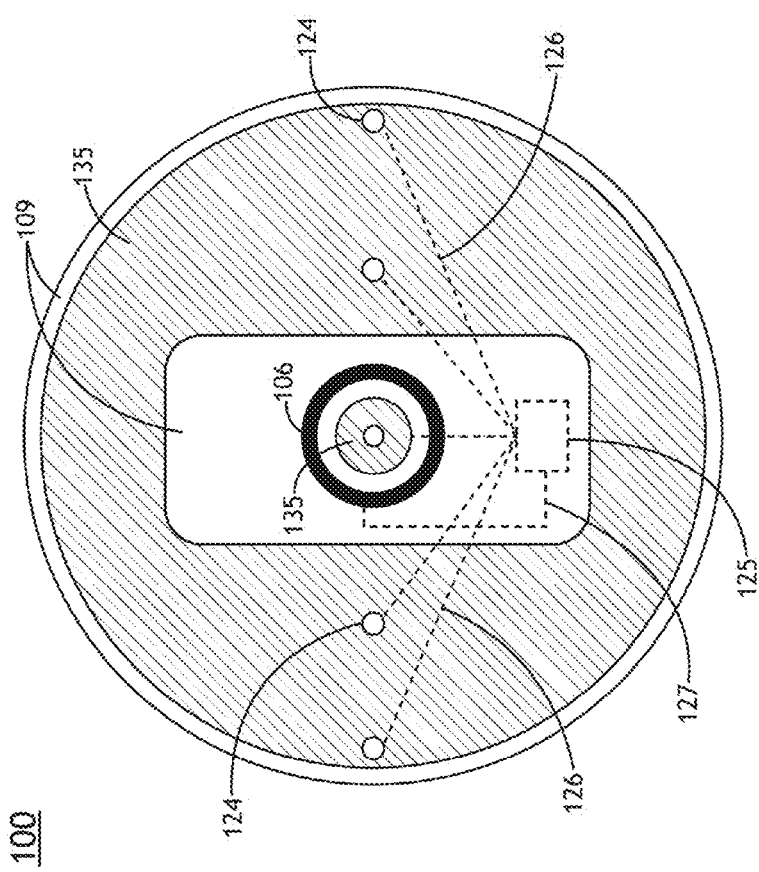

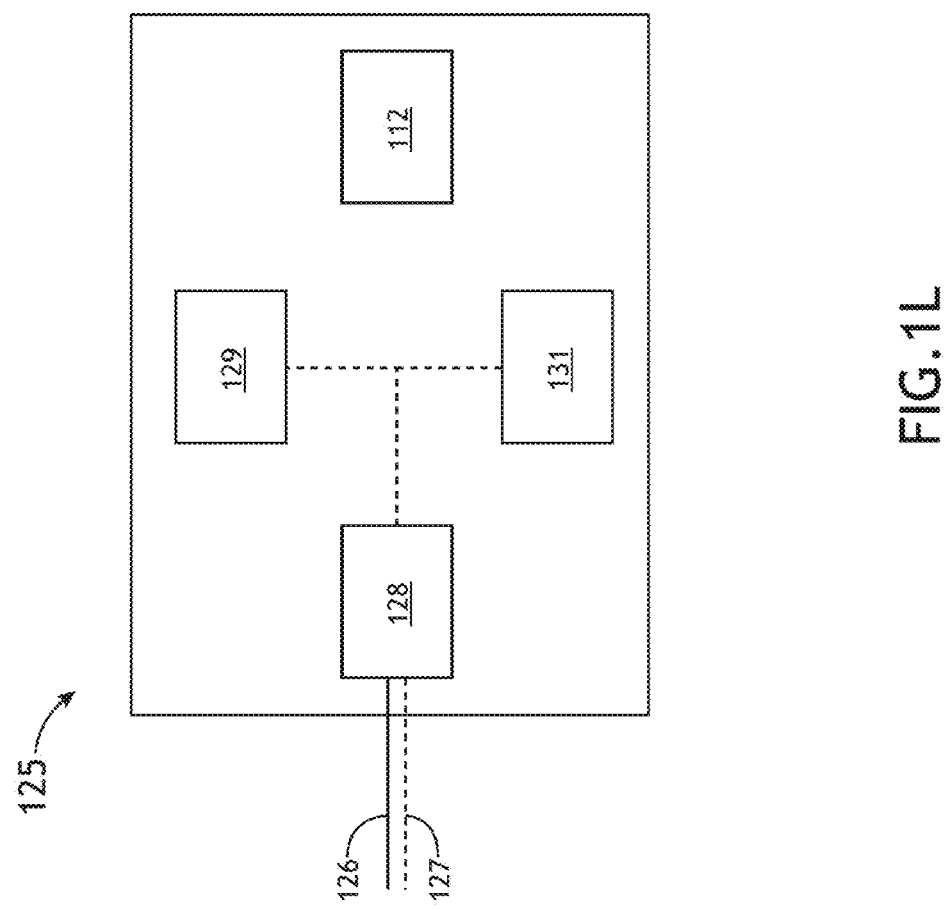

ENCAPSULATED INSTRUMENTED SUBSTRATE APPARATUS FOR ACQUIRING MEASUREMENT PARAMETERS IN HIGH TEMPERATURE PROCESS APPLICATIONS

CROSS-REFERENCE TO RELATED APPLICATION

The present application claims priority under 35 U.S.C. § 119(e) to U.S. Provisional Patent Application Ser. No. 62/350,688 entitled WIRELESS SENSOR WAFER FOR HIGH TEMPERATURE EPI PROCESSES, filed Jun. 15, 2016, naming Mei Sun, Earl Jensen, Jing Zhou and Ran Liu as inventors, which is incorporated herein by reference in the entirety.

TECHNICAL FIELD

The present invention generally relates to monitoring of wafers along a semiconductor process line, and, in particular, to a multiple stage enclosure assembly allowing for operation at high temperature.

BACKGROUND

As tolerances on process conditions in semiconductor device processing environments continue to narrow, the demand for improved process monitoring systems continues to increase. Thermal uniformity within a processing system (e.g., epitaxy chamber) is one such condition. Current methods are unable to monitor temperature under the extreme conditions (e.g., high temperature) required of current processing techniques without contaminating the associated chamber. Therefore, it would be desirable to provide a system and method to allow for high temperature measurement using an instrumented wafer to monitor the conditions of a semiconductor device processing line.

SUMMARY

An apparatus for acquiring measurement parameters in high temperature process applications is disclosed, in accordance with one or more embodiments of the present disclosure. In one embodiment, the apparatus includes a substrate assembly including a bottom substrate and a top substrate. In another embodiment, the top substrate is mechanically coupled to the bottom substrate. In another embodiment, the apparatus includes an electronic assembly. In another embodiment, the apparatus includes a nested enclosure assembly including an outer enclosure and an inner enclosure. In another embodiment, the outer enclosure encloses the inner enclosure. In another embodiment, the inner enclosure encloses at least the electronic assembly. In another embodiment, an insulating medium is disposed within a cavity between an outer surface of the inner enclosure and an inner surface of the outer enclosure. In another embodiment, the apparatus includes a sensor assembly communicatively coupled to the electronic assembly. In another embodiment, the sensor assembly includes one or more sensors. In another embodiment, the one or more sensors are disposed within the substrate assembly at one or more locations across the substrate assembly. In another embodiment, the one or more sensors are configured to acquire one or more measurement parameters at the one or more locations across the substrate assembly. In another embodiment, the electronic assembly is configured to receive the one or more measurement parameters from the one or more sensors.

An apparatus for acquiring measurement parameters in high temperature process applications is disclosed, in accordance with one or more embodiments of the present disclosure. In one embodiment, the apparatus includes a substrate assembly including a bottom substrate and a top coating layer. In another embodiment, the apparatus includes an electronic assembly. In another embodiment, the apparatus includes a nested enclosure assembly that includes an outer enclosure and an inner enclosure. In another embodiment, the outer enclosure encloses the inner enclosure, wherein the inner enclosure encloses at least the electronic assembly. In another embodiment, an insulating medium is disposed within a cavity between the outer surface of the inner enclosure and the inner surface of the outer enclosure. In another embodiment a sensor assembly is communicatively coupled to the electronic assembly, wherein the sensor assembly includes one or more sensors. In another embodiment, the one or more sensors are disposed on the bottom substrate of the substrate assembly at one or more locations across the bottom substrate, wherein the top coating layer at least coats the one or more sensors disposed on the bottom substrate. In another embodiment, the one or more sensors are configured to acquire one or more measurement parameters at the one or more locations across the substrate assembly. In one embodiment, the electronic assembly is configured to receive the one or more measurement parameters from the one or more sensors.

A method for acquiring measurement parameters in high temperature process applications is disclosed, in accordance with one or more embodiments of the present disclosure. In one embodiment, the method includes acquiring a set of measurement parameters with one or more sensors distributed at one or more locations of a substrate assembly. In another embodiment, the method includes storing the set of measurement parameters in an electronic assembly disposed within a nested enclosure assembly. In another embodiment, the method includes calculating a value for each of the measurement parameters.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 1J is a simplified top view of an instrumented substrate apparatus configured with sensors, in accordance with one or more embodiments of the present disclosure.

FIG. 1L is a block diagram view of the electronic assembly contained within the nested enclosure assembly, in accordance with one or more embodiments of the present disclosure.

DETAILED DESCRIPTION OF THE INVENTION

Reference will now be made in detail to the subject matter disclosed, which is illustrated in the accompanying drawings.

Referring generally to FIGS. 1A through 3, a system and method for measuring temperature across an instrumented substrate is described in accordance with the present disclosure.

Embodiments of the present disclosure are directed to an instrumented substrate apparatus capable of operating at high temperatures (e.g., 600° C. to 800° C.). Such an instrumented substrate apparatus may be utilized with semiconductor processing chambers (e.g., epitaxy chamber) operating at high temperatures. In some embodiments, the instrumented substrate apparatus of the present disclosure includes a nested enclosure assembly including a first and second enclosure (e.g., heat shield), whereby the on-board electronic assembly (i.e., electronic package) and/or other sensitive devices are housed within the nested enclosure assembly so as to maintain the temperature of the electronic assembly at or below approximately 150° C., even when the instrumented substrate apparatus is exposed to temperatures as high as 800° C. The use of an instrumented substrate is described in U.S. patent application Ser. No. 15/277,753, filed on Sep. 27, 2016, which is incorporated herein by reference in the entirety.

Figure 1A:
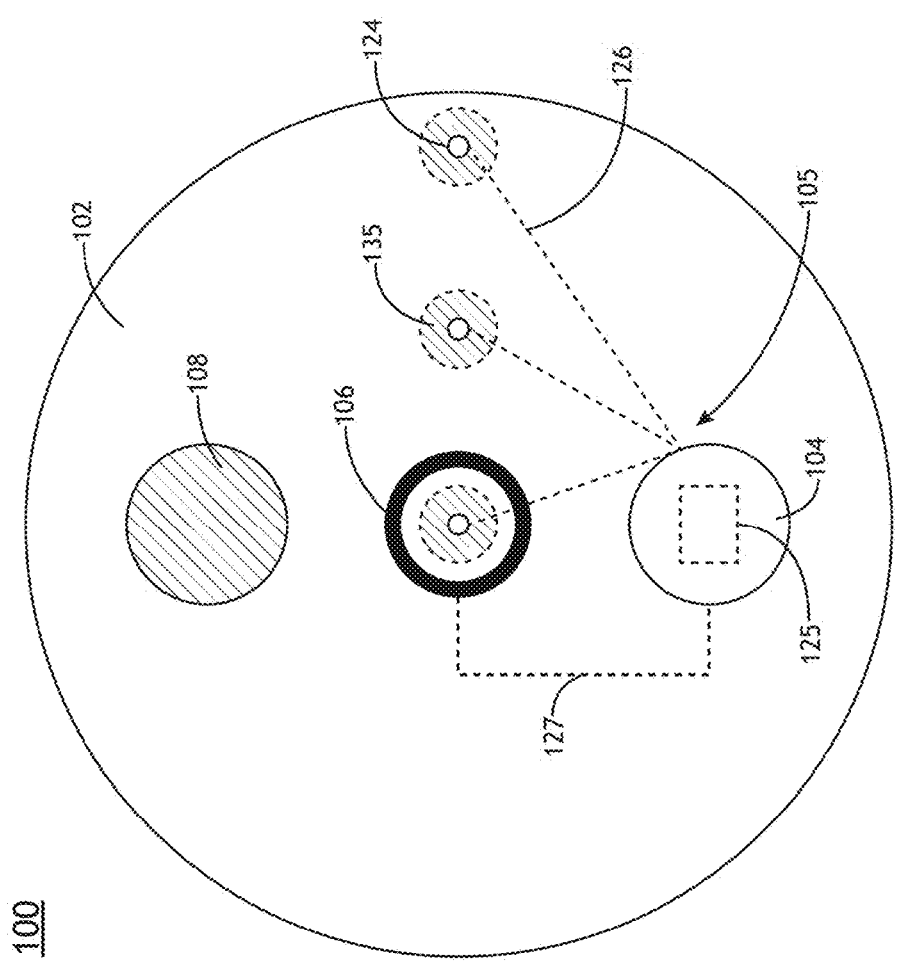
FIG. 1A is a top view of an instrumented substrate apparatus equipped with a nested enclosure assembly, in accordance with one or more embodiments of the present disclosure.
Figure 1B:
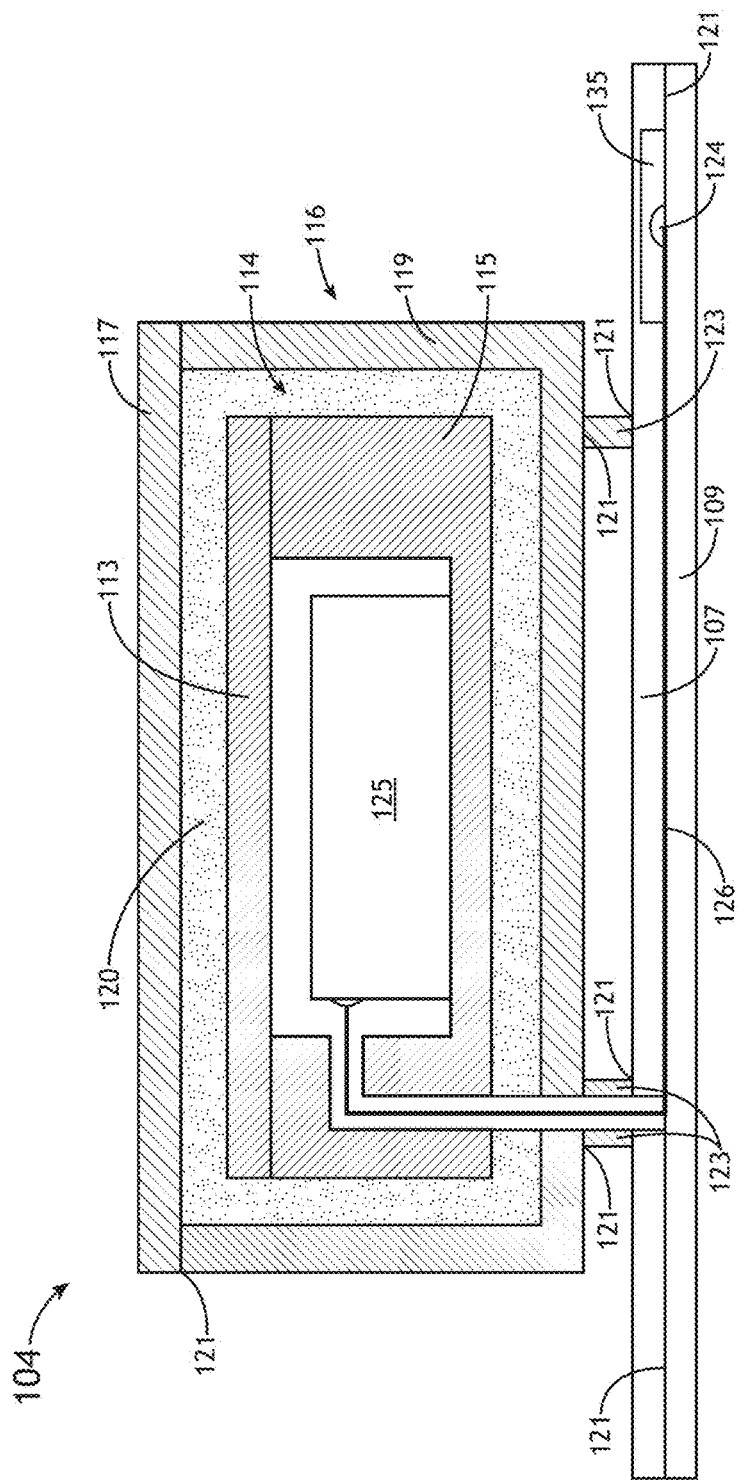
FIG. 1B is a simplified cross-sectional view of the nested enclosure assembly and instrumented substrate apparatus, in accordance with one or more embodiments of the present disclosure.

FIGS. 1A-1B illustrate the instrumented substrate apparatus 100 for acquiring temperature across a substrate assembly 102, in accordance with one or more embodiments of the present disclosure. FIG. 1A illustrates a top view of an instrumented substrate apparatus 100 equipped with a nested enclosure assembly 104, while FIG. 1B illustrates a simplified cross-sectional view of the nested enclosure assembly 104 and instrumented substrate apparatus 100.

In one embodiment, the instrumented substrate apparatus 100 includes a substrate assembly 102, a sensor assembly 105, and a nested enclosure assembly 104.

In one embodiment, the substrate assembly 102 includes a top substrate 107 and a bottom substrate 109. For example, as shown in FIG. 1B, the top substrate 107 may be mechanically coupled to the bottom substrate 109. The top substrate 107 and/or the bottom substrate 109 of the substrate assembly 102 may include any substrate known in the art. In one embodiment, the top substrate 107 and/or the bottom substrate 109 of the substrate assembly 102 includes a wafer. For example, the top substrate 107 and/or the bottom substrate 109 of the substrate assembly 102 may include, but is not limited to, a glass wafer (e.g., fused silica glass wafer, borosilicate glass wafer, and the like), a crystalline wafer (e.g., crystalline quartz wafer or silicon wafer), or a wafer formed from one or more compounds (e.g., silicon carbide, silicon nitride and the like). For instance, the substrate assembly 102 may include any substrate causing negligible contamination in a semiconductor processing environment, such as, but not limited to, a wafer formed from one or more of silicon, silicon carbide, silicon nitride or silicon dioxide (e.g., quartz).

In one embodiment the lower substrate 109 is mechanically coupled to the upper substrate 107. For example, the lower substrate 109 may be welded to the upper substrate 107. By way of another example, the lower substrate 109 may be bonded to the upper substrate 107. In another embodiment, one or more sensor substrates 135 are disposed between the upper substrate 107 and the lower substrate 109 so that the one or more sensor substrates 135 are sealed (e.g., hermetic seal) between the top and bottom substrates 107, 109. The one or more sensor substrates 135 may be formed from any material known in the art. For example, the one or more sensor substrates 135 may be formed from any suitable material including, but not limited to, silicon, silicon carbide, silicon nitride, gallium nitride, gallium arsenide, germanium, or a compound of gallium and indium. For instance, as shown in FIG. 1K, the one or more sensor substrates 135 may include, but are not limited to, one or more silicon disks between the upper substrate 107 and the lower substrate 109. It is noted herein that the one or more sensor substrates 135 may be utilized to aid in thermal transfer and help replicate the various material properties (e.g., heat transfer, thermal expansion, optical properties and the like) of the type of substrate/wafer processed by the given process chamber during the studied process application. The wireline 126 connections between the one or more sensors 124 and the nested enclosure assembly 104 may be sealed (e.g., hermetic seal) within the substrate assembly 102. For example, the wireline 126 connections between the one or more sensors 124 and the nested enclosure assembly 104 are covered by the upper substrate 107, which is mechanically coupled to the lower substrate 109.

In one embodiment, the nested enclosure assembly 104 includes an inner enclosure 114 and an outer enclosure 116 as shown in FIG. 1B. For example, the inner enclosure 114 and outer enclosure 116 may consist of an inner heat shield and an outer heat shield respectively. In another embodiment, the electronic assembly 125 (e.g., processor(s), memory, power source, communication circuitry and etc.) may be disposed within the inner enclosure 114, whereby the inner enclosure 114 is disposed within the outer enclosure 116 to form a nested enclosure structure.

In one embodiment, the inner enclosure 114 is formed from a material having a high heat capacity (e.g., by volume). For example, the inner enclosure 114 may be formed from one or more metal alloys, such as, but not limited to, an iron-nickel-cobalt alloy, a nickel-iron alloy, or an iron-carbon alloy. For instance, the inner enclosure 114 may be formed from one or more of the materials including KOVAR, INVAR, or stainless steel. In the case of the inner enclosure 114 being formed from KOVAR, the electronic assembly 125 (and the components of the electronic assembly 125) of the inner enclosure 114 closely follow the temperature of the inner enclosure 114. By way of another example, the inner enclosure 114 may be formed from one or more crystalline materials, such as, but not limited to, sapphire or crystalline quartz.

In another embodiment, the outer enclosure 116 is formed from one or more materials including, but not limited to, a ceramic, a composite, or a glass. In another embodiment, the outer enclosure 116 is formed from a material causing negligible contamination. For example, the outer enclosure 116 may be formed from one or more low contamination materials including, but not limited to, silicon, silicon carbide, silicon nitride, or silicon oxide.

In one embodiment, the inner enclosure 114 includes a lid 113 and a base 115, whereby the lid 113 may be removed from the base 115 to allow access to the internal portion of the inner enclosure 114. In another embodiment, the outer enclosure 116 includes a lid 117 and a base 119, whereby the lid 117 is mechanically coupled to the base 119 to seal the outer enclosure 116. For example, a weld 121 may mechanically couple the lid 117 to the base 119 to seal (e.g., hermetic seal) the outer enclosure 116. By way of another example, the base 119 may be bonded to the lid 117 to seal (e.g., hermetic seal) the outer enclosure 116 by an adhesive.

In another embodiment, the nested enclosure assembly 104 includes an insulating medium 120 disposed between the inner enclosure 114 and outer enclosure 116. It is noted that the implementation of an insulating medium 120 between the inner and outer enclosures 114, 116 serves to reduce heat transfer from the elevated temperature environment (e.g., semiconductor processing chamber) outside of the outer enclosure 116 to the region within the inner enclosure 114. For example, an insulating medium 120 may be disposed within a cavity between the outer surface of the inner enclosure 114 and the inner surface of the outer enclosure 116. In another embodiment, the insulating medium 120 may include, but is not limited to, a porous solid material. For example, the insulating medium 120 may be one or more aerogel materials (e.g., silica aerogel material). For instance, an aerogel material can be formed with a porosity as high as approximately 98.5%. By way of another example, the insulating medium 120 may be a ceramic material (e.g., porous ceramic material). It is noted herein that during the sintering of a ceramic-based insulating medium the porosity may be controlled through the use of pore formers. It is further noted herein that the porosity of a ceramic material may be fabricated with a porosity range of 50-99%. For example, the porosity of a ceramic material may be fabricated to have a porosity range between 95-99%.

In another embodiment, the insulating medium 120 is opaque. For example, the insulating medium 120 may include, but is not limited to, a material that is absorptive of radiation traversing the volume between the inner surface of the outer enclosure 116 and the outer surface of the inner enclosure 114. For instance, the insulating medium 120 may include, but is not limited to, a carbon-doped aerogel material.

In another embodiment, the insulating medium 120 is low pressure gas (i.e., gas held at vacuum pressure), whereby the gas is maintained at a pressure less than ambient pressure (i.e., pressure of process chamber). In this regard, the volume between the outer surface of the inner enclosure 114 and the inner surface of the outer enclosure 116 may be maintained at a vacuum pressure so as to minimize heat conduction from the outer enclosure 116 and the inner enclosure 114. In another embodiment, the insulating medium 120 is a gas maintained at pressure approximately equal to ambient pressure, but less than atmospheric pressure. In another embodiment, the insulating medium 120 is a gas maintained at pressure higher than ambient pressure, but less than atmospheric pressure. For the purposes of the present disclosure, "vacuum pressure" is interpreted to mean any pressure that is lower than ambient pressure.

In one embodiment, the inner enclosure 114 is supported on the internal surface of the outer enclosure 116 by the insulating medium 120. For example, the inner enclosure 114 may be supported on the internal surface of the outer enclosure 116 by one or more aerogel materials. For instance, the inner enclosure 114 may be supported on the internal surface of the outer enclosure 116 by a silica aerogel material.

Figure 1C:
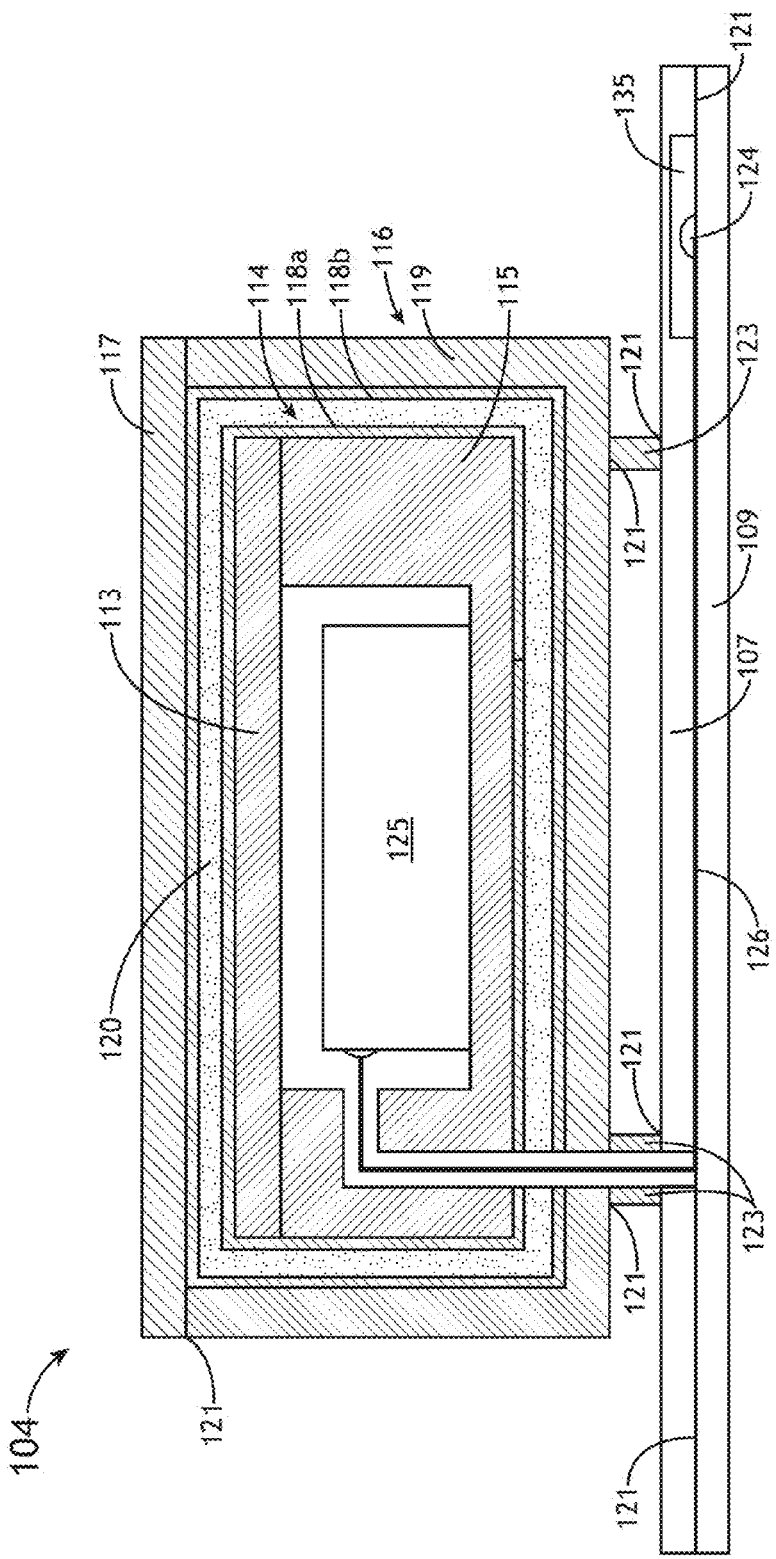
FIG. 1C is a simplified cross-sectional view of the nested enclosure assembly and instrumented substrate apparatus, in accordance with one or more embodiments of the present disclosure.

In another embodiment, as shown in FIG. 1C, the inner enclosure 114 is supported by a layer 120 of low thermal conductivity medium disposed on the internal bottom surface of outer enclosure 116. For example, the layer of low thermal conductivity medium 120 may include one or more porous materials. For instance, the layer of low thermal conductivity medium 120 may include aerogel materials (e.g., silica aerogel material). For further instance, the layer of low thermal conductivity medium may be opaque (e.g., porous ceramic material).

In another embodiment, the outer enclosure 116 is supported on the substrate assembly 102 by one or more support structures 123. In another embodiment, the one or more support structures 123 (e.g., single support leg, multiple support legs, platform) may be formed from a medium having a low thermal conductivity coefficient so as to limit the heat transfer between the substrate assembly 102 and the outer enclosure 116. For example, the one or more support structures 123 may be formed from a low thermal conductivity medium such as, but not limited to, a ceramic, a composite, a crystalline material or a glass. For instance, the one or more support structures 123 may be formed from one or more materials including, but not limited to, silicon, silicon carbide, silicon nitride, or silicon oxide. In another embodiment, the support structures 123 are mechanically coupled to the outer enclosure 116 and the upper substrate 107. For example, a weld 121 may mechanically couple the support structures 123 to the outer enclosure 116 and the upper substrate 107. By way of another example, the support structures may be bonded to the outer enclosure 116 and the upper substrate 107. In another embodiment, one or more of the support structures 123 form one or more passages through which one or more wirelines 126 connect the sensor assembly 105 to the electronic assembly 125. For example, one or more of the support structures 123 may include, but are not limited to, one or more ring or tube structures (e.g., hollow leg structure) that form one or more passages through which one or more wirelines 126 connect the sensor assembly 105 to the electronic assembly 125. Further, a support structure 123 may be a ring structure that is coupled to the outer enclosure 116 and the upper substrate 107. For instance, a support structure 123 may be configured as a ring structure that is welded to the outer enclosure 116 and the upper substrate 107 forming a seal (e.g., hermetic seal). By way of another instance, a support structure 123 may be configured as a ring structure that is bonded to the outer enclosure 116 and the upper substrate 107 forming a seal (e.g., hermetic seal).

Figure 1D:
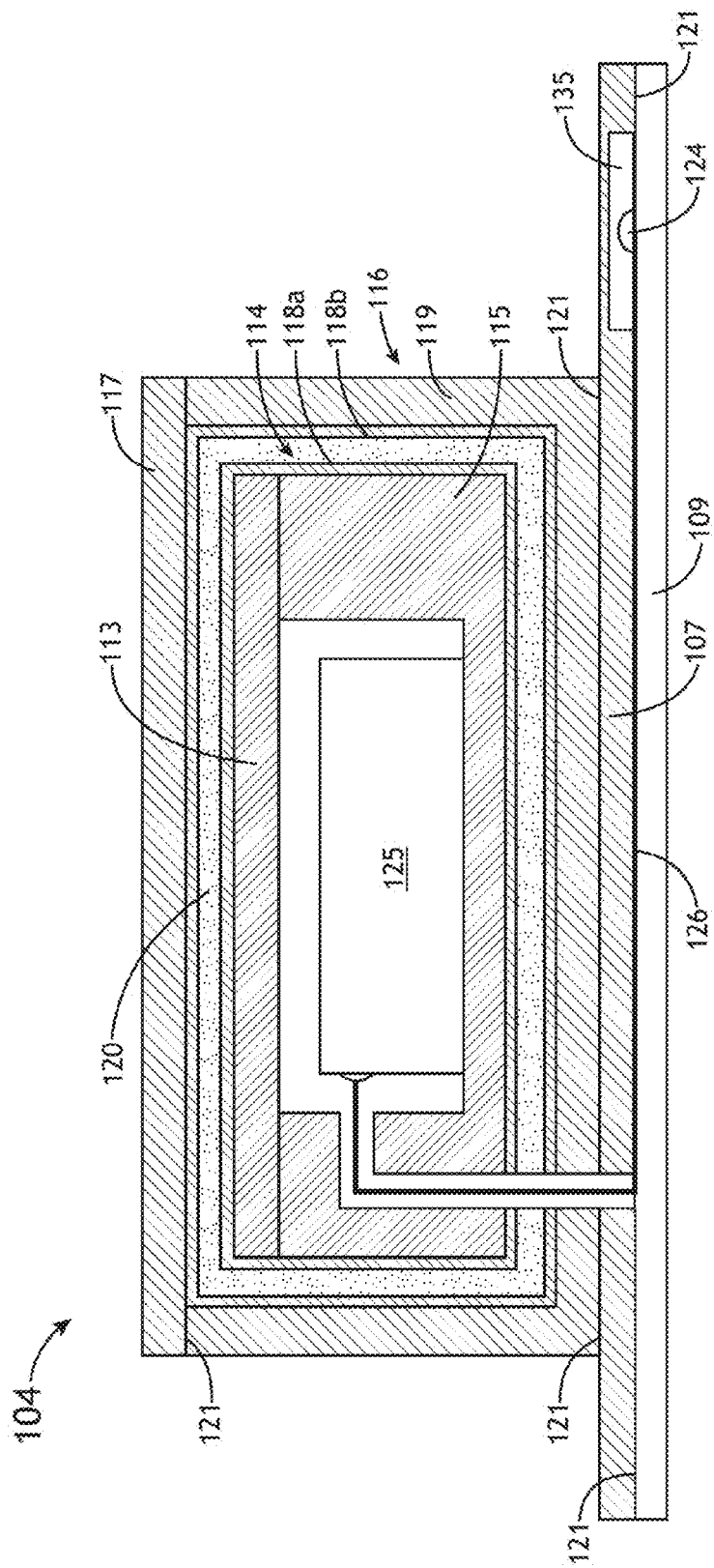
FIG. 1D is a simplified cross-sectional view of the nested enclosure assembly and instrumented substrate apparatus, in accordance with one or more embodiments of the present disclosure.

In another embodiment, the outer enclosure 116 is mechanically coupled to the substrate assembly 102, as shown in FIG. 1D. For example, the outer enclosure 116 is welded to the upper substrate 107 to form a seal (e.g., hermetic seal). By way of another example, the outer enclosure 116 is bonded to the upper substrate 107 to form a seal (e.g., hermetic seal). It is noted herein that mechanically coupling the outer enclosure 116 to the upper substrate 107 reduces the surface area of the outer enclosure 116 exposed to the process chamber.

In another embodiment, as shown in FIG. 1D, a low emissivity and/or high reflectivity layer 118a (e.g., a coating) is disposed on the outer surface of the inner enclosure 114. In another embodiment, a low emissivity and/or high reflectivity layer 118b (e.g., a coating) is disposed on the inner surface of the outer enclosure 116. In another embodiment, the low emissivity and/or high reflectivity layer 118a is disposed on the insulating medium 120 disposed next to the outer surface of the inner enclosure 114. In another embodiment, the low emissivity and/or high reflectivity layer 118b is disposed on the insulating medium 120 disposed next to the inner surface of the outer enclosure 116.

It is noted herein that, in the case of a high reflectivity layer disposed next to the inner surface of the outer enclosure 116, the high reflectivity layer 118b serves to reflect most of the thermal radiation falling onto the outer enclosure 116 from the processing chamber walls or any radiation lamp that may be present in the processing chamber. Further, the presence of a high reflectivity layer disposed next to the outer surface of the inner enclosure 114 serves to reflect most of the thermal radiation falling onto the inner enclosure 114 from the inner surface of the outer enclosure 116. In addition, the utilization of a low emissivity material disposed next to the inner surface of the outer enclosure 116 serves to reduce the amount of radiant thermal energy emitted by the outer enclosure 116, thereby reducing the amount of available radiant thermal energy that could be absorbed by the inner enclosure 114. Further, the utilization of a low emissivity material disposed next to the inner surface of the outer enclosure 116 serves to reduce the amount of radiant thermal energy emitted by the inner enclosure 114, thereby reducing the amount of available radiant thermal energy that could be absorbed and transferred to the electronic assembly 125 within the inner enclosure 114.

In another embodiment, the layer 118a and/or 118b are high reflectivity and low emissivity materials such as, but not limited to, gold, silver, or aluminum. In another embodiment, the layer 118a and/or 118b may be a high reflectivity and low emissivity material formed from a stacked dielectric film. For example, the layer 118a and/or 118b may be a high reflectivity and low emissivity stacked dielectric film formed from materials including, but not limited to, an oxide, a carbide, or a nitride.

Referring again to FIG. 1A, in one embodiment, the electronic assembly 125 is coupled to the sensor assembly 105. In another embodiment, the sensor assembly 105 includes one or more sensors 124. In another embodiment, the sensors 124 may be disposed at one or more locations across the substrate assembly 102 and connected to the electronic assembly 125 via one or more wireline connections 126. In this regard, the one or more electronic assemblies 125 may acquire one or more measurement parameters (e.g., voltage from thermocouple, resistance from resistance temperature device, voltage (or other signal) from a pressure sensor, voltage (or other signal) from a radiation sensor, voltage (or other signal) from a chemical sensor and the like) indicative of values from the one or more sensors 124 located at one or more locations of the substrate assembly 102. In another embodiment, the electronic assembly 125 is communicatively coupled to a remote data system 103. In another embodiment the electronic assembly 125 transmits a plurality of measurement parameters to a remote data system 103.

It is noted that the one or more sensors 124 may include any measurement device known in the art. For example, the one or more sensors 124 may include, but are not limited to, a thermal sensor, pressure sensor, a radiation sensor and/or a chemical sensor. For instance, in the case of temperature measurements, the one or more sensors 124 may include, but are not limited to, one or more thermocouple (TC) devices (e.g., thermoelectric junction) or one or more resistance temperature devices (RTDs) (e.g., thin film RTD). In another instance, in the case of pressure measurements, the one or more sensors 124 may include, but are not limited to, a piezoelectric sensor, a capacitive sensor, an optical sensor, a potentiometric sensor and the like. In another instance, in the case of radiation measurements, the one or more sensors may include, but are not limited to, one or more light detectors (e.g., photovoltaic cell, photoresistor and the like) or other radiation detectors (e.g., solid state detector). In another instance, in the case of chemical measurements, the one or more sensors 124 may include, but are not limited to, one or more chemiresistors, gas sensors, pH sensors and the like.

In another embodiment, the instrumented substrate apparatus 100 includes a dummy enclosure assembly 108. For example, a dummy enclosure assembly 108 may be placed at a selected position on the substrate assembly 102 so as to serve as a counterbalance weight to offset the weight of the nested enclosure assembly 104. For instance, the dummy enclosure assembly 108 may be placed opposite to the nested enclosure assembly 104 at the same distance from the center of the substrate assembly 102 as the nested enclosure assembly 104. It is noted herein that placement of the dummy enclosure assembly 108 at a position opposite of the nested enclosure assembly 104 serves to maintain the center of mass of the instrumented substrate apparatus 100 at the center of the substrate assembly 102. In another embodiment, although not shown, the nested enclosure assembly 104 may be positioned at the center of the substrate assembly 102 so as to maintain the center of mass of the instrumented substrate apparatus 100 at the center of the substrate assembly 102.

Figure 1E:
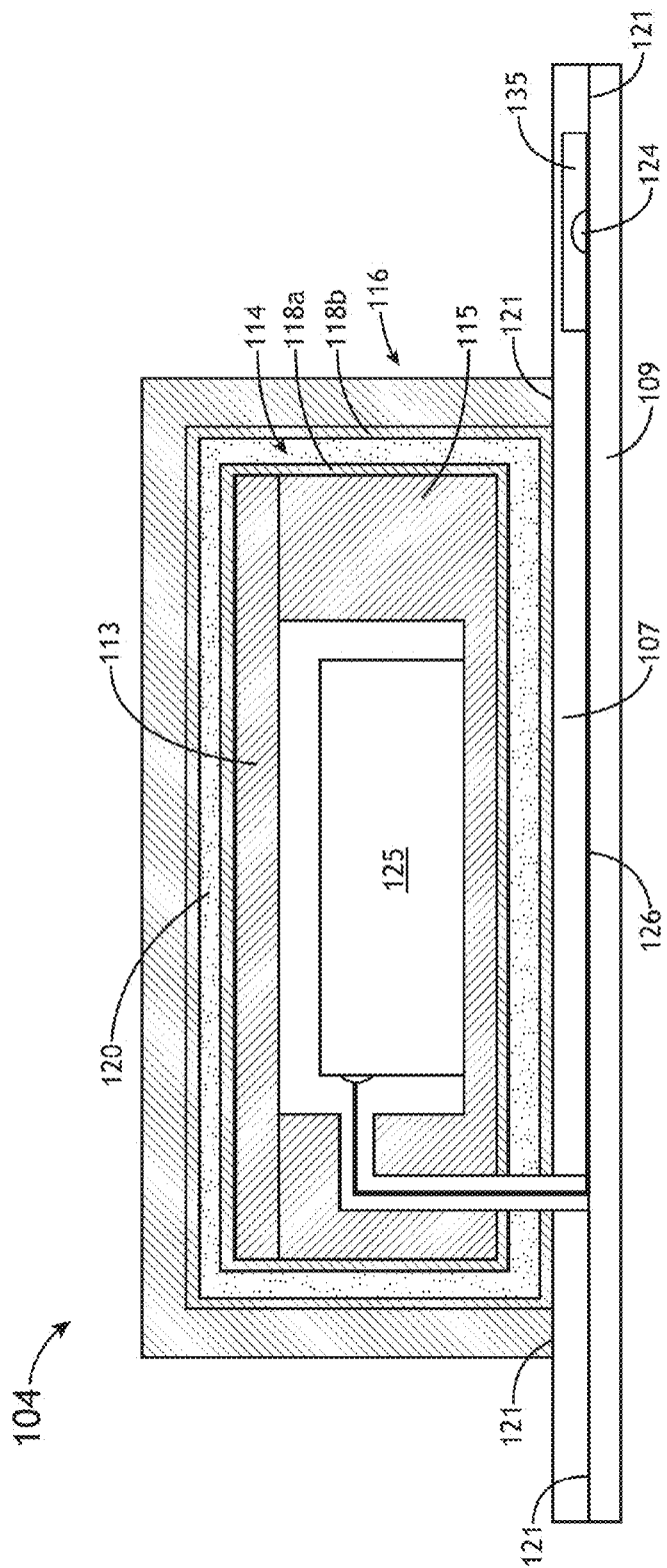
FIG. 1E is a simplified cross-sectional view of the nested enclosure assembly and instrumented substrate apparatus, in accordance with one or more embodiments of the present disclosure.

FIG. 1E is a simplified cross-sectional view of the nested enclosure assembly 104 and instrumented substrate apparatus 100. In one embodiment, the outer enclosure 116 is formed as one part (e.g., cup structure). For example, the outer enclosure 116 may be formed from a single piece of fused silica glass. In one embodiment, the one piece outer enclosure 116 is mechanically coupled to the substrate assembly 102. For example, the one piece outer enclosure 116 may be welded or bonded to the upper substrate 107. It is noted that construction of the outer enclosure 116 in a single piece provides a reduced profile for the instrumented substrate apparatus 100.

Figure 1F:
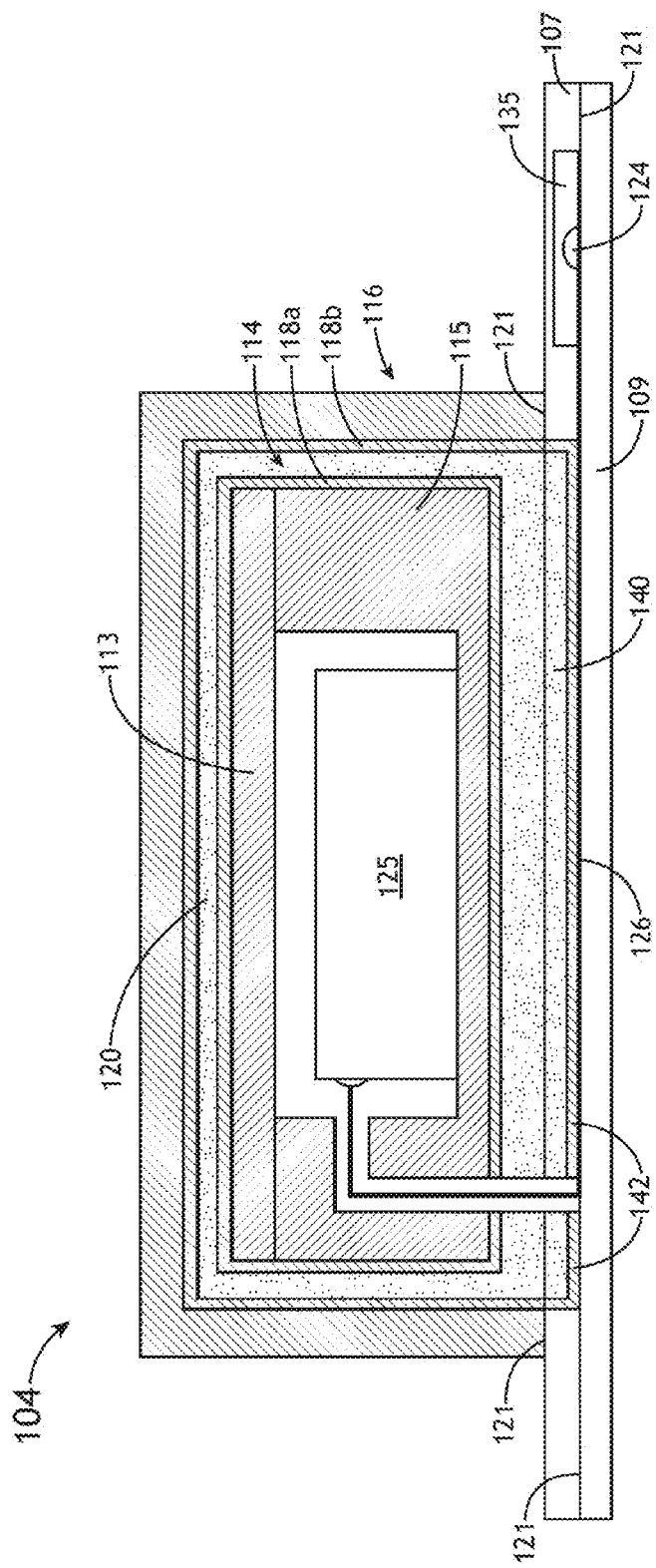
FIG. 1F is a simplified cross-sectional view of the nested enclosure assembly and instrumented substrate apparatus, in accordance with one or more embodiments of the present disclosure.

FIG. 1F is a simplified cross-sectional view of the nested enclosure assembly 104 and instrumented substrate apparatus 100. In one embodiment, a central portion of the upper substrate 107 is removed. In another embodiment, an additional layer of insulating medium 140 may be disposed on the bottom substrate 109 and in the central portion of the upper substrate 107 to provide additional thermal insulation. In addition, an additional layer of high reflectivity material 142 may be disposed between the additional insulating medium material 140 and the bottom substrate 109, whereby the high reflectivity material 142 and the insulating material 140 fill the central portion region of the upper substrate 107.

Figure 1G:
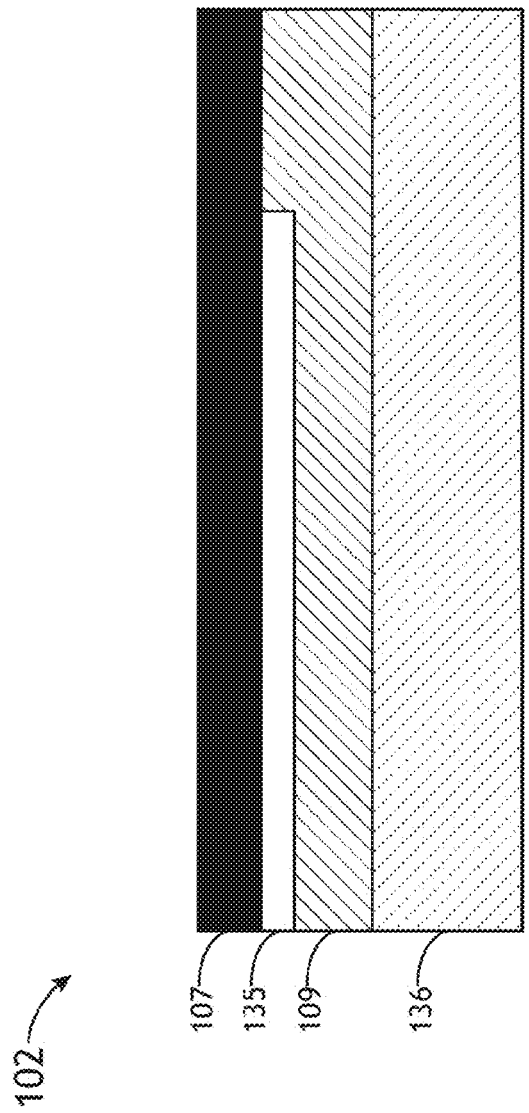
FIG. 1G is a simplified cross-sectional view of the instrumented substrate apparatus, in accordance with one or more embodiments of the present disclosure.

FIG. 1G is a simplified cross-sectional view of a portion of the instrumented substrate apparatus 100, in accordance with one or more embodiments of the present disclosure. In one embodiment, the one or more sensors 124 and sensor substrates 135 are sealed between the upper substrate 107 and the lower substrate 109. For example, the sensors 124 and sensor substrates 135 are sealed (e.g., hermetic seal) inside the substrate assembly 102 preventing exposure to the process chamber gases 136 (e.g., nitrogen, helium and the like).

Figure 1H:
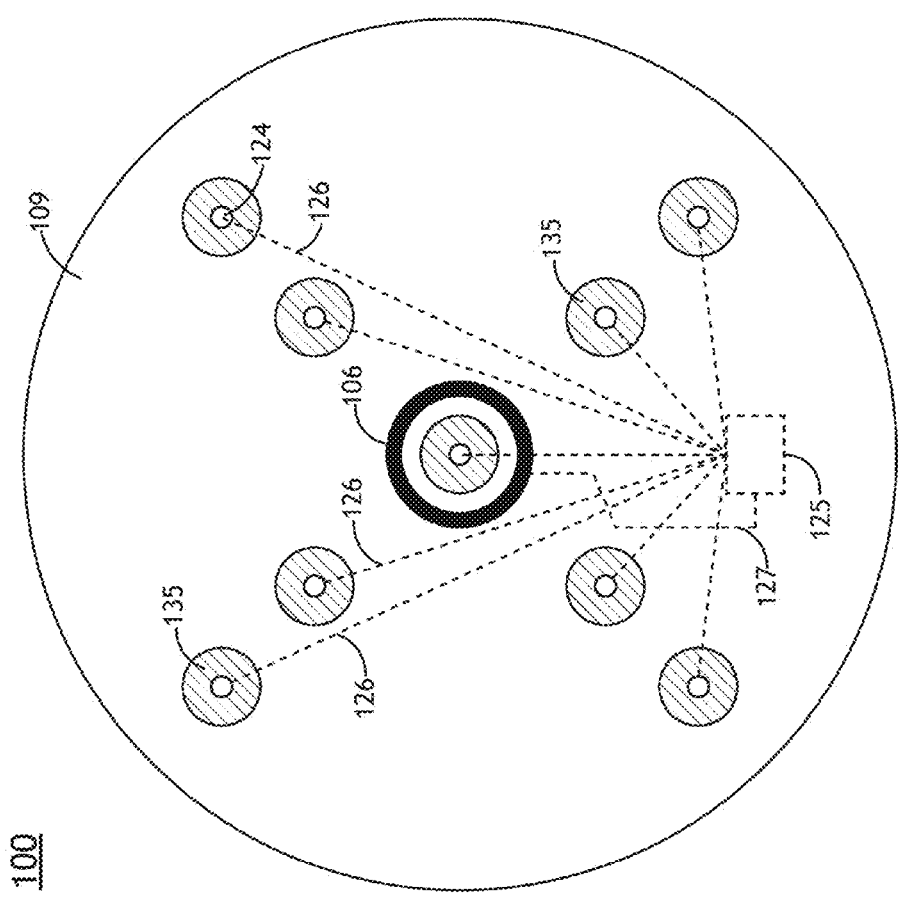
FIG. 1H is a simplified top view of an instrumented substrate apparatus configured with sensors, in accordance with one or more embodiments of the present disclosure.
Figure 1I:
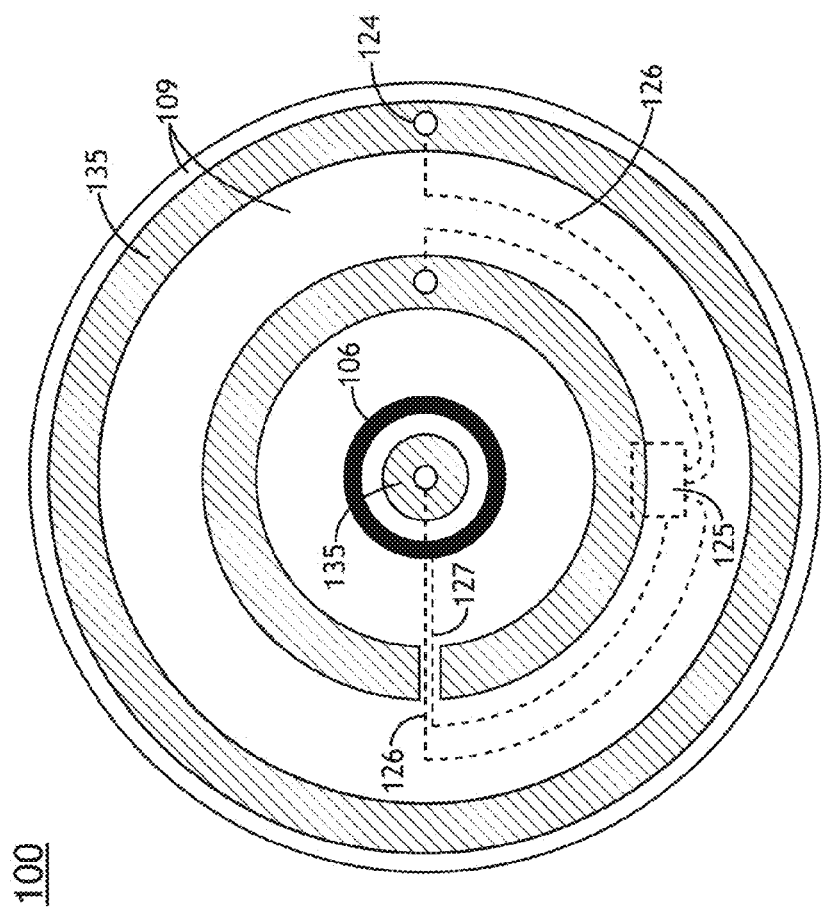
FIG. 1I is a simplified top view of an instrumented substrate apparatus configured with sensors, in accordance with one or more embodiments of the present disclosure.
Figure 1K:
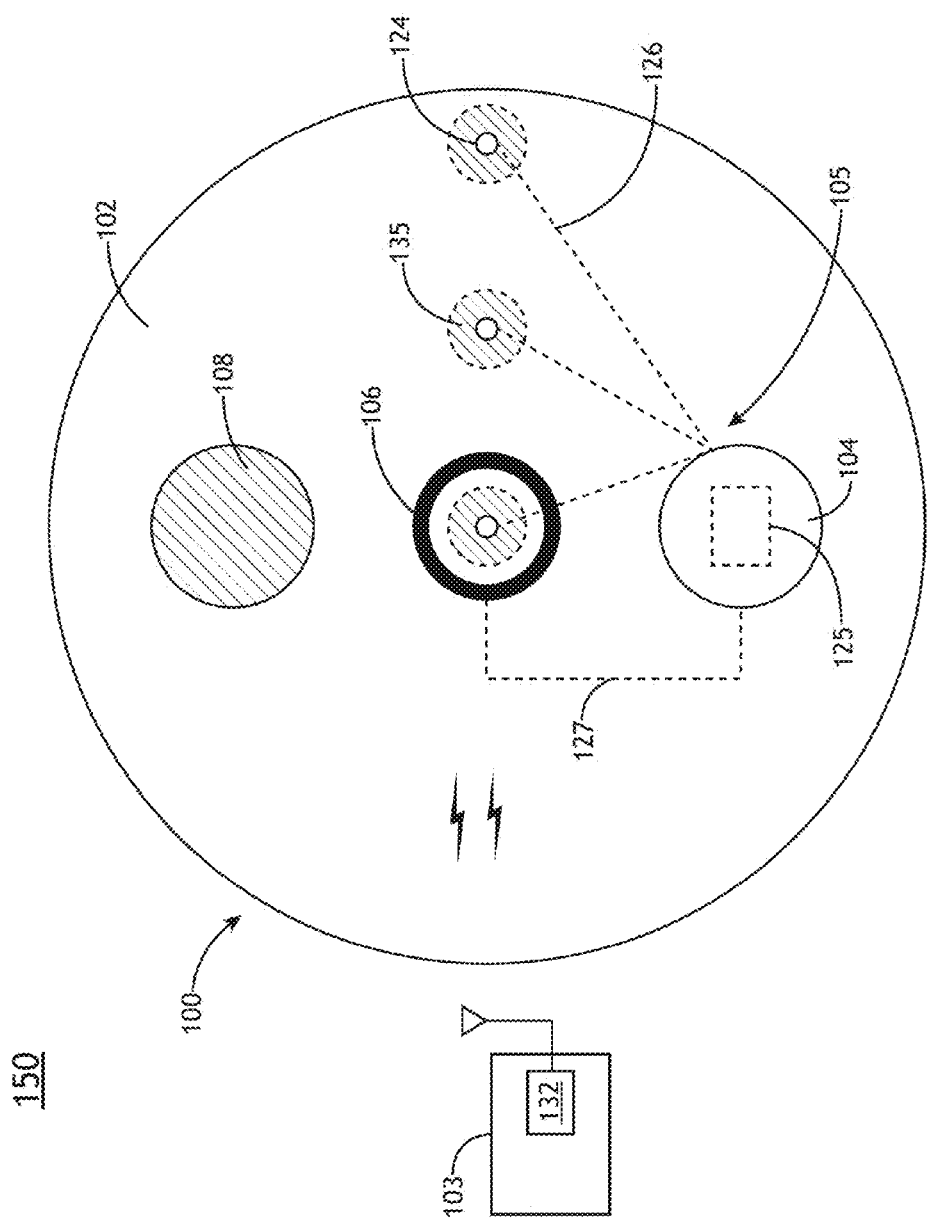
FIG. 1K is a top view of an instrumented substrate apparatus placed in communication with a remote data system, in accordance with one or more embodiments of the present disclosure.

It is noted that the sensor substrates 135 may be formed so as to have any shape and be distributed in any manner across the bottom substrate 109. FIGS. 1H-1J illustrate a number of substrate sensors configurations, in accordance with one or more embodiments of the present disclosure. For purposes of simplicity, the top substrate (107 in other drawings) is not depicted in FIGS. 1H-1J. As shown in FIG. 1H, in one embodiment, a set of sensor substrates 135 are distributed across the bottom substrate 109 in a selected geometric pattern (e.g., cross-shape as shown in FIG. 1H). Further, one or more sensors 124 may be disposed on, in or under each of the sensor substrates 135.

As shown in FIG. 1I, in another embodiment, one or more sensor substrates 135 are configured as a ring disposed between the lower substrate 109 and the upper substrate 107 (upper substrate not shown for clarity). For example, as depicted in FIG. 1I, the medium set of sensor substrates 135 may be configured in concentric rings of various sizes disposed on the bottom substrate 109. Further, one or more sensors 124 may be disposed on, in or under each of the ring sensor substrates 135.

As shown in FIG. 1J, in another embodiment, a single sensor substrate 135 may be disposed on the bottom substrate 109, with one or more sensors 124 disposed on the sensor substrate 135. For example, as shown in FIG. 1J, a sensor substrate 135 may be shaped as a disk with a central portion removed.

It is noted that the arrangement and number of sensor substrates 135 and sensors 124 depicted above are not limiting and are provided merely for illustrated purposes. Rather, it is recognized herein that the one or more sensor substrates 135 and/or one or more sensors 124 of the present disclosure may be configured in a number of patterns, shapes and quantities.

Further, while much of the present disclosure has focused on an implementation of the instrumented substrate apparatus 100 equipped with a top substrate, this configuration is not a limitation on the scope of the present disclosure. Rather, the scope of the present disclosure may be extended to a number of equivalent embodiments. For example, referring again to FIGS. 1A and 1B, the top substrate 107 of the substrate assembly 102 may be replaced with a top coating material. For instance, the one or more sensor substrates 135 and/or one or more sensors 124 may be disposed on a bottom substrate 109. After placement of the one or more sensor substrates 135 and/or one or more sensors 124 a coating material may be applied to the bottom substrate 109, the one or more substrates 135 and/or the one or more sensors 124 thereby sealing at least the one or more sensors 124. For example, the coating material may form a high reflectivity and low emissivity thin film, such as, but not limited to, a silicon dioxide thin film, over the bottom substrate 109, the one or more substrates 135 and/or the one or more sensors 124.

FIG. 1K illustrates an instrumented substrate assembly system 150 including the instrumented substrate apparatus 100 and a remote data system 103. In one embodiment, the one or more electronic assemblies 125 are wirelessly communicatively coupled to the remote data system 103. The one or more electronic assemblies 125 may be wirelessly communicatively coupled to the remote data system 103 in any suitable manner. For example, the instrumented substrate apparatus 100 may include communication circuitry 106. The communication circuitry 106 may include any communication circuitry and/or communication device known in the art of communication. For instance, the communication circuitry 106 may include, but is not limited to, one or more communication antennas (e.g., communication coil). In one embodiment, the communication circuitry 106 is configured to establish a communication link between the electronic assembly 125 and the off-substrate remote data system 103. Further, the communication circuitry 106 is communicatively coupled to the electronic assembly 125 (e.g., coupled via electrical interconnect 127). In this regard, the electronic assembly 125 may transmit one or more signals indicative of the measurement parameters acquired by the one or more sensors 124 to the communication circuitry 106 via one or more interconnects 127. In turn, the communication circuitry 106 may relay one or more signals indicative of the measurement parameters to the remote data system 103. In one embodiment, the remote data system 103 includes communication circuitry 132 suitable for establishing the communication link between the on-substrate communication circuitry 106 and the remote data system 103. For example, the communication circuitry 132 may establish the communication link between the on-substrate communication circuitry 106 and the remote data system 103 using a radio frequency (RF) signal. As discussed further herein, the values associated with the sensor measurements may be calculated by the electronic assembly 125 and/or the remote data system 103.

In one embodiment, the electronic assembly 125 calculates one or more values based on the one or more measurement parameters acquired by the one or more sensors 124. In turn, the electronic assembly 125 may transmit the calculated values to the remote data system 103. In another embodiment, the values are calculated by the remote data system 103. In this regard, the electronic assembly 125 transmits one or more measurement parameters to the remote data system 103. In turn, the remote data system 103 may calculate one or more values based on the one or more measurement parameters acquired by the sensors 124.

In another embodiment, the remote data system 103 maps (or correlates) the one or more values calculated by the electronic assembly 125 or the remote data system 103 based on the one or more signals acquired by sensors 124 to the position of acquisition on the substrate assembly 102. In another embodiment, the remote data system 103 reports the mapped values to a user interface. For example, the remote data system 103 may report mapped values to one or more of a desktop computer, laptop, tablet, handheld device, memory or a server.

FIG. 1L illustrates a block diagram of the electronic assembly 125 contained within the nested enclosure assembly 104, in accordance with one or more embodiments of the present disclosure. In one embodiment, the electronic assembly 125 includes a power source 112 (e.g., one or more batteries). In another embodiment, the electronic assembly 125 includes one or more processors 129. In another embodiment, the electronic assembly 125 includes communication circuitry 128. In another embodiment, the electronic assembly 125 may include a memory medium 131 (e.g., memory) for storing the program instructions to configure the one or more processors 129. Further, the measurement parameters acquired by the electronic assembly 125 enclosed within the nested enclosure assembly 104 may be stored in memory 131 of the electronic assembly 125. For the purposes of the present disclosure, the term 'processor' may be broadly defined to encompass any device having one or more processors (e.g., CPU) or logic elements (e.g., ASICs), which execute instructions from a memory medium 131. In this sense, the one or more processors 129 of the electronic assembly 125 may include any microprocessor-type or logic device configured to execute algorithms and/or instructions. It should be recognized that the steps described throughout the present disclosure may be carried out by a single processor or, alternatively, multiple processors. The memory medium 131 may include a read-only memory, a random access memory, a solid state drive, flash, EPROM, EEPROM, and the like.

Figure 2:
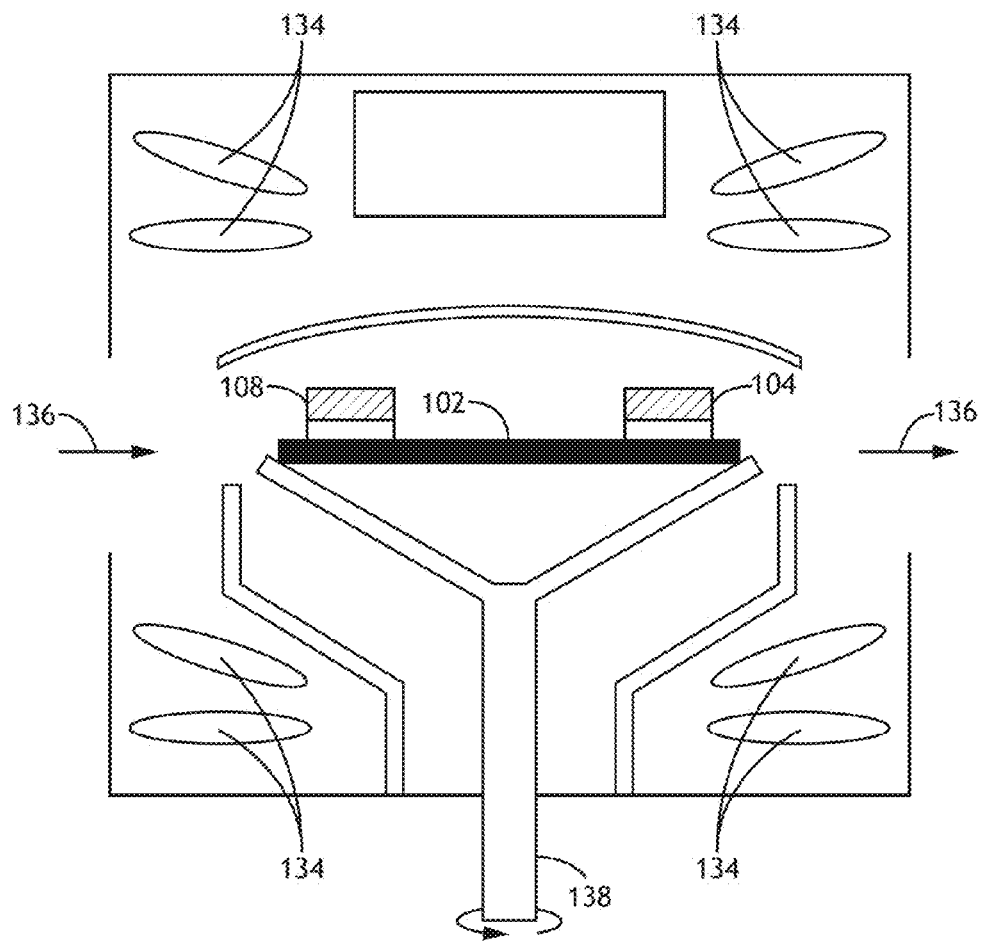
FIG. 2 is a block diagram of a process chamber including an instrumented substrate apparatus, in accordance with one or more embodiments of the present disclosure.

FIG. 2 illustrates a process chamber configured with an instrumented substrate apparatus 100, in accordance with one or more embodiments of the present disclosure. In one embodiment, the instrumented substrate apparatus 100 is disposed on a rotatable platform 138. In another embodiment, process chamber gases 136 flow over the substrate assembly 102. For example, as previously discussed, the instrumented substrate assembly 102 is sealed (e.g., hermetic seal) so process chamber gases 136 do not enter the substrate assembly 102. In another embodiment, one or more heating sources 134 are used to heat the process chamber. For example, heating lamps above and below the instrumented substrate apparatus 100 heat the process chamber.

Figure 3:
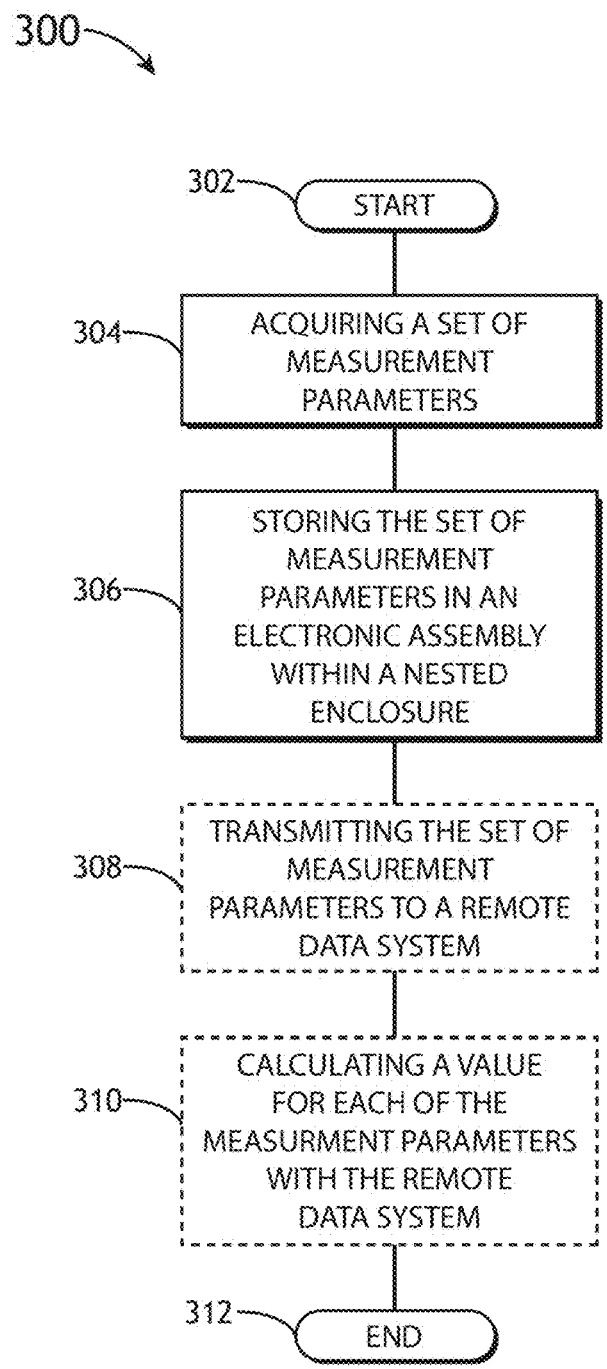
FIG. 3 is a flow diagram illustrating a method for calculating temperatures across an instrumented substrate apparatus, in accordance with one or more embodiments of the present disclosure.

FIG. 3 illustrates a flow diagram depicting a method 300 of acquiring measurement parameters across a substrate, in accordance with one or more embodiments of the present disclosure. It is noted herein that the steps of the flow diagram in FIG. 3 are not to be interpreted as limiting and are provided merely for illustrative purposes.

In one embodiment, the process starts at step 302. In step 304, the process includes measuring a set of measurement parameters (e.g., TC voltage, RTD resistance and the like) at a set of sensors 124 disposed about the substrate assembly 102 at a set of locations. Then, in step 306, after the measurement parameters are measured, the results are stored in memory (e.g., memory 131 of electronic assembly 125) enclosed in the nested enclosure 104. In step 308, the set of measurement parameters are transmitted to the remote data system 103. For example, the measurement data may be wirelessly transmitted from the electronic assembly 125 to the remote data system 103 via communication circuitry 106 (e.g., communication antenna) by a radio frequency (RF) signal. In step 310, a value is calculated by the remote data system 103 for each of the measurement parameters acquired by each of the sensors 124 disposed at each of the locations of the substrate assembly 102. For example, in the case of temperature, the value associated with one of the sensors 124 may be calculated based on a parameter indicative of temperature measured at that sensor. It is noted herein that the results for each of the sensors 124 may then be mapped to the surface of the substrate assembly 102. For example, the remote data system 103 (or another data system) may correlate the values measured by each sensor of the set of sensors 124. Then, based on the known position of each of the sensors 124 the remote data system 103 can form a database and/or map of the values at the top surface of the substrate assembly 102 as a function of position in the plane of the top surface (e.g., X-Y position) of the substrate assembly 102. In another embodiment, the database and/or map of values is presented on a display of a user interface (not shown). In step 312, the process ends.

It is recognized that the steps of the method 300 may be carried out via system 150. It should, however, be recognized that the system 150 should not be interpreted as a limitation on process 300 or the method of measuring values across a substrate assembly 102 as it is contemplated that a variety of processes may be carried out by system 150 resulting in a plurality of process flows to acquire measurements and determine values at a plurality of locations on a substrate assembly 102. For example, after measurement parameters have been acquired for all of the one or more sensors 124 the electronic assembly 125 may calculate a value for each measurement parameter acquired by the one or more sensors 124.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An apparatus comprising:
a substrate assembly including a bottom substrate and a top substrate, wherein the top substrate is mechanically coupled to the bottom substrate;
an electronic assembly;
a nested enclosure assembly including an outer enclosure and an inner enclosure, wherein the outer enclosure encloses the inner enclosure, wherein the inner enclosure encloses at least the electronic assembly;
an insulating medium disposed within a cavity between an outer surface of the inner enclosure and an inner surface of the outer enclosure; and
a sensor assembly communicatively coupled to the electronic assembly, wherein the sensor assembly includes one or more sensors, the one or more sensors disposed within the substrate assembly at one or more locations across the substrate assembly, wherein the one or more sensors are configured to acquire one or more measurement parameters at the one or more locations across the substrate assembly, wherein the electronic assembly is configured to receive the one or more measurement parameters from the one or more sensors, wherein the apparatus is disposed on a rotatable platform.

2. The apparatus of claim 1, wherein the one or more sensors comprise:
one or more temperature sensors configured to acquire one or more parameters indicative of temperature.

3. The apparatus of claim 2, wherein the one or more temperature sensors comprise:
one or more thermocouple devices.

4. The apparatus of claim 2, wherein the one or more temperature sensors comprise:
one or more resistance temperature devices.

5. The apparatus of claim 1, wherein the one or more sensors comprise:
one or more pressure sensors configured to acquire one or more parameters indicative of pressure.

6. The apparatus of claim 1, wherein the one or more sensors comprise:
one or more chemical sensors configured to acquire one or more parameters indicative of a presence of a targeted chemical.

7. The apparatus of claim 1, wherein the one or more sensors comprise:
one or more radiation sensors configured to acquire one or more parameters indicative of a presence of radiation.

8. The apparatus of claim 1, wherein the one or more sensors are coated with a high reflectivity material.

9. The apparatus of claim 1, wherein at least one of the bottom substrate or the top substrate are formed from at least one of a ceramic, a cermet, a crystalline material or a glass.

10. The apparatus of claim 9, wherein at least one of the bottom substrate or the top substrate are formed from at least one of silicon, silicon carbide, silicon nitride or silicon dioxide.

11. The apparatus of claim 1, wherein the bottom substrate and the top substrate are sealed by at least one of welding or bonding.

12. The apparatus of claim 1, wherein the enclosure assembly is mechanically coupled to the substrate assembly.

13. The apparatus of claim 12, wherein the enclosure assembly is sealed to the substrate assembly by at least one of welding or bonding.

14. The apparatus of claim 1, wherein the electronic assembly comprises:
one or more processors;
communication circuitry;
memory; and
a power source.

15. The apparatus of claim 1, further comprising:
a dummy enclosure assembly, wherein the dummy enclosure assembly is disposed at a position on the substrate assembly to maintain a center of mass of the apparatus at a center of the substrate assembly.

16. The apparatus of claim 1, wherein each of the one or more sensors are disposed on or within a sensor substrate, wherein the sensor substrate is disposed between the bottom substrate and the top substrate of the substrate assembly.

17. The apparatus of claim 16, wherein the sensor substrate comprises:
at least one of a silicon substrate, a silicon carbide substrate, a silicon nitride substrate, a gallium nitride substrate, a gallium arsenide substrate, a germanium substrate, or a substrate of gallium and indium.

18. The apparatus of claim 1, wherein the insulating medium comprises:
a porous solid material.

19. The apparatus of claim 18, wherein the insulating medium is opaque.

20. The apparatus of claim 19, wherein the insulating medium is absorptive.

21. The apparatus of claim 18, wherein the insulating medium comprises:
an aerogel.

22. The apparatus of claim 18, wherein the insulating medium comprises:
a ceramic material.

23. The apparatus of claim 1, wherein the insulating medium comprises:
one or more gases.

24. The apparatus of claim 23, wherein the one or more gases is maintained at a pressure less than atmospheric pressure.

25. The apparatus of claim 24, wherein the one or more gases is maintained at a pressure less than ambient pressure.

26. The apparatus of claim 1, further comprising:
one or more support structures supporting the inner enclosure on the inner surface of the outer enclosure.

27. The apparatus of claim 26, wherein the one or more support structures are formed from a thermal insulating material.

28. The apparatus of claim 1, further comprising:
a layer of thermal insulating material disposed between an outer surface of a bottom portion of the inner enclosure and an inner surface of a bottom portion of the outer enclosure.

29. The apparatus of claim 1, further comprising:
one or more support structures for supporting the outer enclosure on the substrate.

30. The apparatus of claim 1, wherein the inner enclosure is formed from a material having a heat capacity above a selected value.

31. The apparatus of claim 1, wherein the inner enclosure is formed from at least one of a metal, an alloy, or a composite.

32. The apparatus of claim 31, wherein the inner enclosure is formed from at least one of an iron-nickel-cobalt alloy, an iron-nickel alloy, or an iron-carbon alloy.

33. The apparatus of claim 1, wherein the inner enclosure is formed from one or more crystalline materials.

34. The apparatus of claim 33, wherein the inner enclosure is formed from at least one of sapphire or crystalline quartz.

35. The apparatus of claim 1, wherein the outer enclosure is formed from at least one of a ceramic, a cermet, a crystalline material or a glass.

36. The apparatus of claim 1, wherein the outer enclosure is formed from a material having a contamination rate below a selected level.

37. The apparatus of claim 36, wherein the outer enclosure is formed from at least one of silicon, silicon carbide, silicon nitride or silicon dioxide.

38. The apparatus of claim 1, further comprising:
at least one of a high reflectivity layer disposed on the outer surface of the inner enclosure, or a high reflectivity layer disposed on the inner surface of the outer enclosure, or between the inner surface of the outer enclosure and the outer surface of the inner enclosure.

39. The apparatus of claim 38, wherein the high reflectivity layer includes at least one of gold, silver or aluminum.

40. The apparatus of claim 38, wherein the high reflectivity layer is a stacked dielectric film comprising at least one of an oxide, a nitride or a carbide.

41. The apparatus of claim 1, wherein the electronic assembly is configured to calculate one or more values from the one or more acquired measurement parameters.

42. The apparatus of claim 1, further comprising:
a remote data system communicatively coupled to the electronic assembly, wherein the electronic assembly is configured to transmit the one or more measurement parameters to the remote data system, wherein the remote data system is configured to calculate a value from the one or more acquired measurement parameters acquired by the one or more sensors.

43. The apparatus of claim 42, wherein the remote data system is configured to map the one or more values to the one or more locations of the substrate.

44. The apparatus of claim 43, wherein the remote data system is configured to report the mapped one or more values to a user interface.

45. An apparatus comprising:
a substrate assembly including a bottom substrate and a top coating layer;
an electronic assembly;
a nested enclosure assembly including an outer enclosure and an inner enclosure, wherein the outer enclosure encloses the inner enclosure, wherein the inner enclosure encloses at least the electronic assembly;
an insulating medium disposed within a cavity between an outer surface of the inner enclosure and an inner surface of the outer enclosure; and
a sensor assembly communicatively coupled to the electronic assembly, wherein the sensor assembly includes one or more sensors, the one or more sensors disposed on the bottom substrate of the substrate assembly at one or more locations across the bottom substrate, wherein the top coating layer at least coats the one or more sensors disposed on the bottom substrate, wherein the one or more sensors are configured to acquire one or more measurement parameters at the one or more locations across the substrate assembly, wherein the electronic assembly is configured to receive the one or more measurement parameters from the one or more sensors, wherein the apparatus is disposed on a rotatable platform.

46. A method comprising:
acquiring a set of measurement parameters with one or more sensors of a sensor assembly, wherein the one or more sensors are distributed at one or more locations of a substrate assembly;
storing the set of measurement parameters in an electronic assembly communicatively coupled to the sensor assembly and disposed within a nested enclosure assembly including an outer enclosure and an inner enclosure, wherein the outer enclosure encloses the inner enclosure, wherein the inner enclosure encloses the electronic assembly, wherein an insulating medium disposed within a cavity between an outer surface of the inner enclosure and an inner surface of the outer enclosure, wherein the sensor assembly, electronic assembly, and the nested enclosure assembly are disposed on a rotatable platform; and
calculating a value for each of the measurement parameters.

* * * * *